(12) United States Patent
Kuo et al.

(10) Patent No.: US 8,947,961 B2
(45) Date of Patent: Feb. 3, 2015

(54) MANAGEMENT OF NON-VOLATILE MEMORY

(71) Applicant: Macronix International Co., Ltd., Hsinchu (TW)

(72) Inventors: Lung Yi Kuo, Jhubei (TW); Hsin Yi Ho, Hsinchu (TW); Chun Hsiung Hung, Hsinchu (TW); Shuo-Nan Hung, Jhubei (TW); Han-Sung Chen, Hsinchu (TW); Shih-Chou Juan, Yangmei (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 13/950,942

(22) Filed: Jul. 25, 2013

(65) Prior Publication Data

US 2014/0269074 A1 Sep. 18, 2014

Related U.S. Application Data

(60) Provisional application No. 61/776,796, filed on Mar. 12, 2013.

(51) Int. Cl.
| | |
|---|---|
| G11C 16/04 | (2006.01) |
| G11C 16/06 | (2006.01) |
| G11C 29/00 | (2006.01) |
| G11C 16/10 | (2006.01) |
| G11C 29/04 | (2006.01) |

(52) U.S. Cl.
CPC ............ *G11C 16/10* (2013.01); *G11C 29/04* (2013.01)
USPC ............ 365/201; 365/185.09; 365/185.29

(58) Field of Classification Search
USPC .............................................. 365/201
See application file for complete search history.

(56) References Cited

U.S. PATENT DOCUMENTS

| | | | | |
|---|---|---|---|---|
| 5,933,852 | A | * | 8/1999 | Jeddeloh ................ 711/153 |
| 7,366,825 | B2 | * | 4/2008 | Williams et al. ........... 711/103 |
| 8,407,400 | B2 | * | 3/2013 | Marotta et al. ............ 711/103 |
| 2007/0081401 | A1 | * | 4/2007 | Chen ...................... 365/200 |
| 2012/0185740 | A1 | * | 7/2012 | Hsu et al. ................ 714/719 |
| 2013/0103884 | A1 | * | 4/2013 | Cho ...................... 711/102 |

\* cited by examiner

*Primary Examiner* — Son Mai
(74) *Attorney, Agent, or Firm* — Finnegan, Henderson, Farabow, Garrett & Dunner LLP

(57) ABSTRACT

A method for programming a non-volatile memory including a plurality of blocks, each block including a plurality of sections, each section including at least one page, and each page including a plurality of memory cells. The method includes checking a current section of the plurality of sections against a damaged section table to determine whether the current section is damaged. The damaged section table records information about whether a section in the memory is good or damaged. The method further includes using the current section for programming if the current section is not damaged.

21 Claims, 5 Drawing Sheets

Fail Bit: 0 - Good (Not-Damaged) WL Section
 1 - Bad (Damaged) WL Section

MANAGEMENT OF NON-VOLATILE MEMORY

CROSS-REFERENCE TO RELATED APPLICATIONS

This application is based upon and claims the benefit of priority from Provisional Application No. 61/776,796, filed on Mar. 12, 2013, the entire content of which is incorporated herein by reference.

TECHNOLOGY FIELD

The disclosure relates to managing damaged sections in non-volatile memories and, more particularly, to methods for programming non-volatile memories having damaged sections.

BACKGROUND

In a non-volatile (NV) memory, such as a NAND type flash memory or a 3D vertical gate (3DVG) NAND flash memory, memory cells are usually managed in a hierarchical structure. The basic programming unit in a NV memory is a page, in which a group of memory cells may be programmed together during a programming process. One or more pages may be controlled by a word line (WL), which applies a voltage to control gates of the memory cells in the page. In a conventional non-3DVG NV memory, a WL may control only one page. However, in a 3DVG NV memory, a WL may control multiple pages, such as 4 or 8 pages, stacked vertically one on another. As used herein, a group of pages controlled by the same WL is referred to as a WL section (note that for a conventional non-3DVG NV memory, a WL section may be equivalent to one page). Further, a group of WL sections, such as 32 or 64 WL sections, may form a block, which constitutes a unit for erasing. That is, all memory cells in a block are erased together in one erasing operation.

A WL, a page, or a memory cell in a NV memory can be damaged due to various reasons, so that the pages controlled by the damaged WL, the damaged page, or the damaged memory cell may become inaccessible or not able to store data, and thus become useless. For example, in a 3DVG NV memory, a WL may be damaged due to WL open or a WL short. A WL section having a damaged WL, damaged page, or damaged memory cell is referred to herein as a damaged WL section. Conventionally, in a NV memory, a logical-to-physical (L2P) mapping is designed at a block level. That is, each block in the NV memory is assigned a L2P mapping. Therefore, it may be difficult to bypass a damaged WL section in a block. Consequently, a block with damaged WL sections would be marked as a bad block and thus not usable to store data. That is, one damaged WL section in a block, which may comprise 32 or 64 WL sections, would cause the entire block to be useless, even if other WL sections in the block are not damaged. This results in wasted storage capacity. On the other hand, if the L2P mapping is designed at a page level (i.e., each page being assigned a L2P mapping), the amount of RAM required for L2P mapping may be significantly increased, which could significantly increase cost.

SUMMARY

In accordance with the disclosure, there is provided a method for programming a non-volatile memory. The memory includes a plurality of blocks, each block includes a plurality of sections, each section includes at least one page, and each page includes a plurality of memory cells. The method includes checking a current section of the plurality of sections against a damaged section table to determine whether the current section is damaged. The damaged section table records information about whether a section in the memory is good or damaged. The method further includes using the current section for programming if the current section is not damaged.

Also in accordance with the disclosure, there is provided an apparatus for controlling programming of a non-volatile memory. The memory includes a plurality of blocks, each block includes a plurality of sections, each section includes at least one page controlled by a same word line, and each page includes a plurality of memory cells. The apparatus includes a storage medium configured to store a damaged section table recording information about whether a section in the memory is good or damaged. The apparatus further includes a controller configured to check a current section of the plurality of sections against the damaged section table to determine whether the current section is damaged, and use the current section for programming if the current section is not damaged.

Features and advantages consistent with the disclosure will be set forth in part in the description which follows, and in part will be obvious from the description, or may be learned by practice of the disclosure. Such features and advantages will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate several embodiments of the invention and together with the description, serve to explain the principles of the invention.

DESCRIPTION OF THE EMBODIMENTS

Embodiments consistent with the disclosure include methods for managing a non-volatile memory by locating and programming a good word line (WL) section in the memory, and apparatuses for managing a non-volatile memory by locating and programming a good WL section in the memory.

Hereinafter, embodiments consistent with the disclosure will be described with reference to drawings. Wherever possible, the same reference numbers will be used throughout the drawings to refer to the same or like parts.

Figure 1:
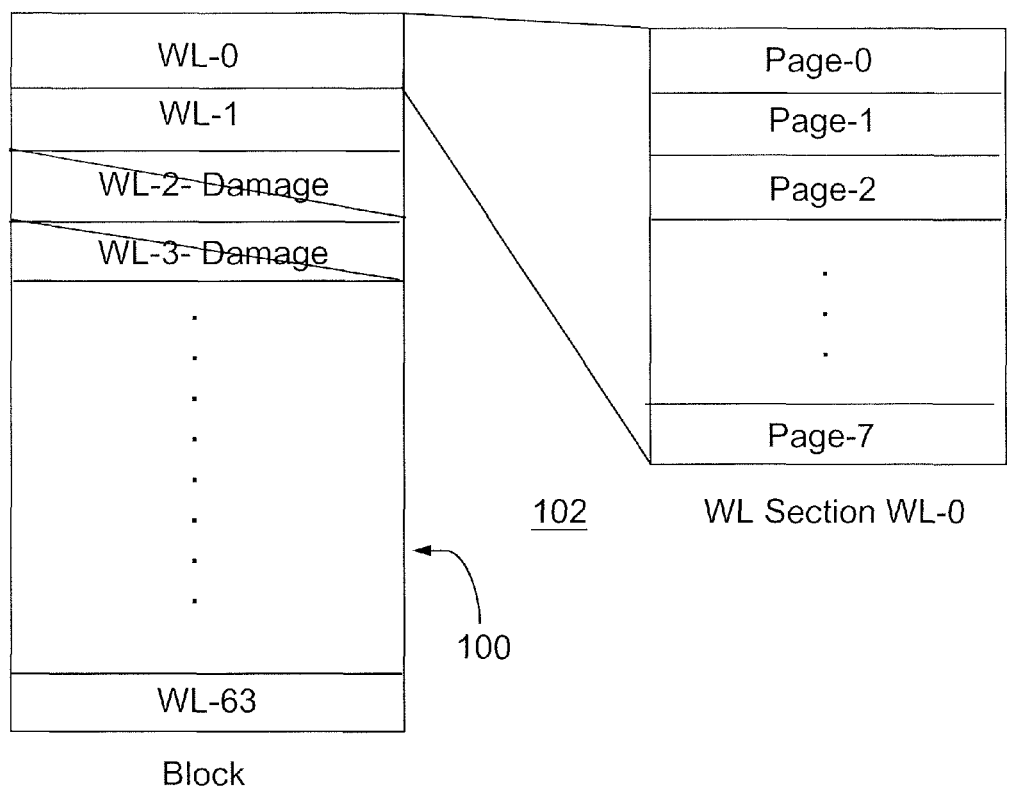
FIG. 1 schematically illustrates a hierarchical structure of an exemplary block of memory cells in a memory.

FIG. 1 schematically illustrates a hierarchical structure of an exemplary block 100 in a non-volatile memory 102. As shown in FIG. 1, the exemplary block 100 includes 64 WL sections: WL-0 to WL-63. Each of the WL sections in the exemplary block 100 includes 8 pages. For example, WL section WL-0 includes pages Page-0 to Page-7. In the exemplary block 100 shown in FIG. 1, WL sections WL-2 and WL-3 are damaged. Conventionally, because of the damaged WL sections WL-2 and WL-3, the exemplary block 100 would be marked as damaged and thus not used to store data. Consistent with embodiments of the disclosure, the damaged WL sections WL-2 and WL-3 are "bypassed," and other good WL sections in the exemplary block 100 can still be used to store data. It is noted that FIG. 1 is for illustrative purpose. A block in a memory may have a different hierarchical structure than shown in FIG. 1. For example, a block may include greater or fewer WL sections, and a WL section may include greater or fewer pages. Methods and apparatuses consistent with embodiments of the disclosure may be applied to both the exemplary block and other blocks having different hierarchical structures.

Figure 2:
FIG. 2 shows an exemplary damaged word line (WL) table provided for all WL sections in a memory.

Consistent with embodiments of the disclosure, a damaged WL table is provided to record information about whether a WL section in a memory is good or damaged. In some embodiments, a damaged WL table is provided for all WL sections in a memory. In other embodiments, a damaged WL table is provided for fewer than all of the WL sections in a memory. For example, FIG. 2 shows an exemplary damaged WL table 200 provided for all WL sections of a non-volatile memory. In the memory associated with the damaged WL table shown in FIG. 2, there are totally 262,144 WL sections: WL-0 to WL-262143. Each WL section is assigned a failure indicator indicating whether the corresponding WL section is good or damaged. The failure indicator may be a fail bit that has a value of either 0 or 1, as shown in FIG. 2. In the example shown in FIG. 2, a fail bit having a value of 0 indicates the corresponding WL section is not damaged, while a fail bit having a value of 1 indicates the corresponding WL section is damaged. In other embodiments, this can be reversed.

Consistent with embodiments of the disclosure, in the damaged WL table 200, WL sections may be identified by their physical addresses (hereinafter, such a physical address is also referred to as a physical WL address). Thus, damage information about a particular WL section can be obtained by searching for that WL section in the damaged WL table 200 using its physical WL address as an index.

Consistent with embodiments of the disclosure, the damaged WL table 200 may be created by testing a memory after the memory is manufactured. During the test, if a WL is damaged, or a WL section contains one or more pages that are damaged, the corresponding WL section is assigned a failure indicator indicating the WL section is damaged. After the damaged WL table 200 is created, it is stored in, for example, an assigned section of the memory. The assigned section contains some of the non-damaged pages. Subsequently, a test flow can read the information in the damaged WL table 200 and save the damaged WL table 200 into another memory, e.g., a mass storage device such as a hard disk drive. Additionally, when the memory is being accessed by a host, the damaged WL table 200 may be loaded to a RAM.

Consistent with embodiments of the disclosure, a logical-to-physical address mapping table is provided for WL sections in a memory (hereinafter, such a mapping table is referred to as a WL L2P table). The WL L2P table may be provided for all WL sections in the memory, or may be provided for a portion of the WL sections in the memory. In some embodiments, the WL L2P table contains address mapping for each of a plurality of WL sections in the memory. That is, each address mapping recorded in the WL L2P table relates a logical address of a WL (hereinafter such a logical address is also referred to as a logical WL address) to a physical WL address of that WL (i.e., the address mapping "translates" a logical WL address to a physical WL address). The logical WL address may be an address used by a host, e.g., a system using the memory, to identify a WL section. The physical WL address of a WL section may be mapped to different logical WL addresses, for example, when different hosts are accessing the memory, or when different applications are being run.

In some embodiments, one or more blocks of the memory are reserved to store the WL L2P table. When the memory is being accessed by a host, a portion of or the entire WL L2P table may be loaded to a RAM used by the host. The blocks reserved to store the WL L2P table may be controlled by a memory controller.

Figure 3:
FIG. 3 schematically shows a word line logical-to-physical address mapping table according to an exemplary embodiment.

FIG. 3 schematically shows an exemplary WL L2P table 300 consistent with embodiments of the disclosure. In the exemplary WL L2P table 300 shown in FIG. 3, N pairs of logical-physical WL addresses are shown, where N is the maximum number of logical WL sections addressable by the host using the WL L2P table 300. In some embodiments, N may be smaller than the total number of actual (physical) WL sections in a memory used by the host. In FIG. 3, the number following "Log-" represents the sequence of the logical addresses. Similarly, the number following "Phy-" represents the sequence of the physical addresses. As shown in FIG. 3, the sequence of logical WL addresses in the WL L2P table 300 may not be consistent with the sequence of physical WL addresses. For example, in FIG. 3, the first logical WL address Log-0 corresponds to the first physical WL address Phy-0, the second logical WL address Log-1 corresponds to the 11th physical WL address Phy-10, and the last logical WL address Log-(N−1) corresponds to the (K−1)th physical WL address Phy-K. Therefore, using a WL L2P table consistent with embodiments of the disclosure may provide random access to WL sections in a memory, i.e., a WL-section level random access.

Consistent with embodiments of the disclosure, in a WL section, the correspondence between logical addresses of pages and physical addresses of pages may be continuous and sequential. That is, the relative position of a logical address of a page in a WL section may be the same as the relative position of a physical address of a page in the WL section.

As described above, the WL L2P table 300 may contain address mapping for each of a plurality of WL sections in a memory. In other embodiments, however, several physically-continuous WL sections in a memory may be grouped together, and the WL L2P table 300 may contain address mapping for each of a plurality of such groups. That is, each address mapping recorded in the WL L2P table may relate a logical address and a physical address of one of the groups of physically-continuous WL sections. For example, an address mapping recorded in the WL L2P table may relate the logical WL address and the physical WL address of one predetermined WL section, such as the first WL section, in a group of physically-continuous WL sections. The physical addresses of other WL sections in the group may be determined by the address mapping and relative positions of the other WL sections in the group. As another example, a group of physically-continuous WL sections may be assigned a logical address and a physical address as a whole, and an address mapping recorded in the WL L2P table may relate the logical address and the physical address of the group. The physical WL addresses of the WL sections in the group may be determined by the address mapping and relative positions of the WL sections in the group.

Figure 4A:
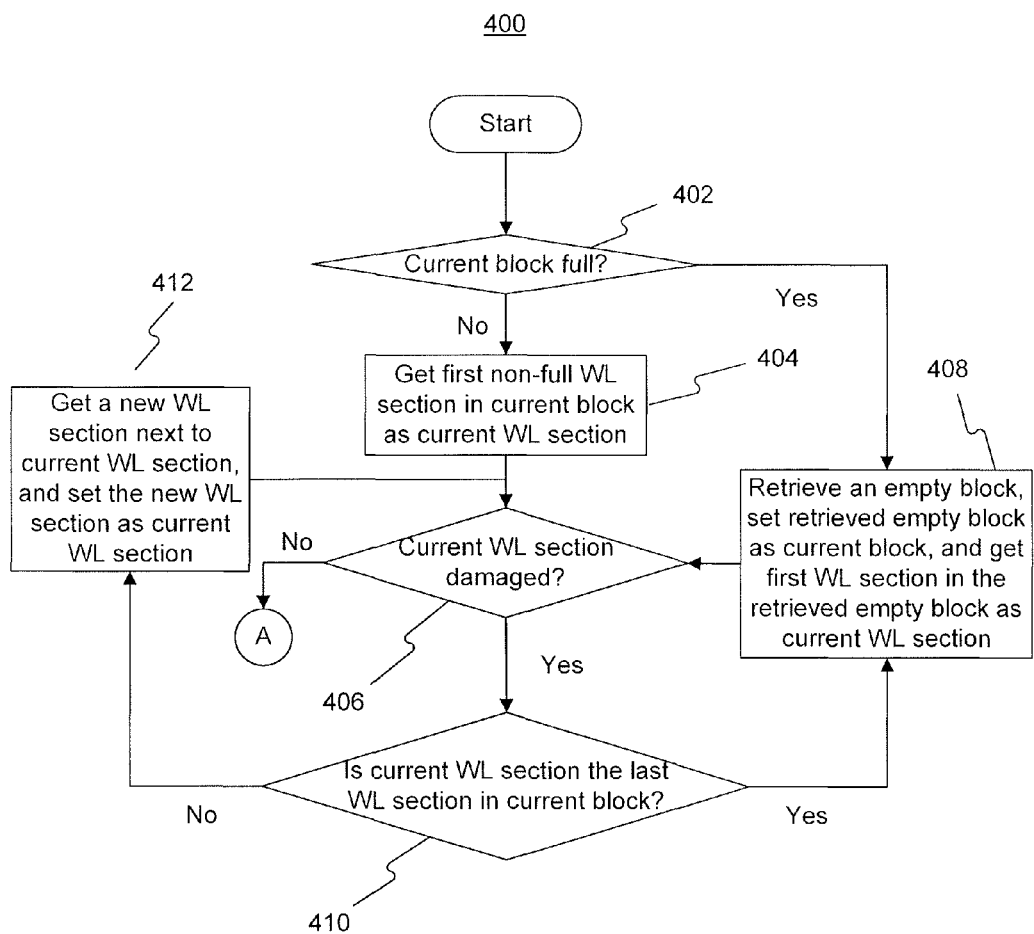
FIGS. 4A and 4B are a flow chart showing a process according to an exemplary embodiment for locating and programming a good WL section.
Figure 4B:
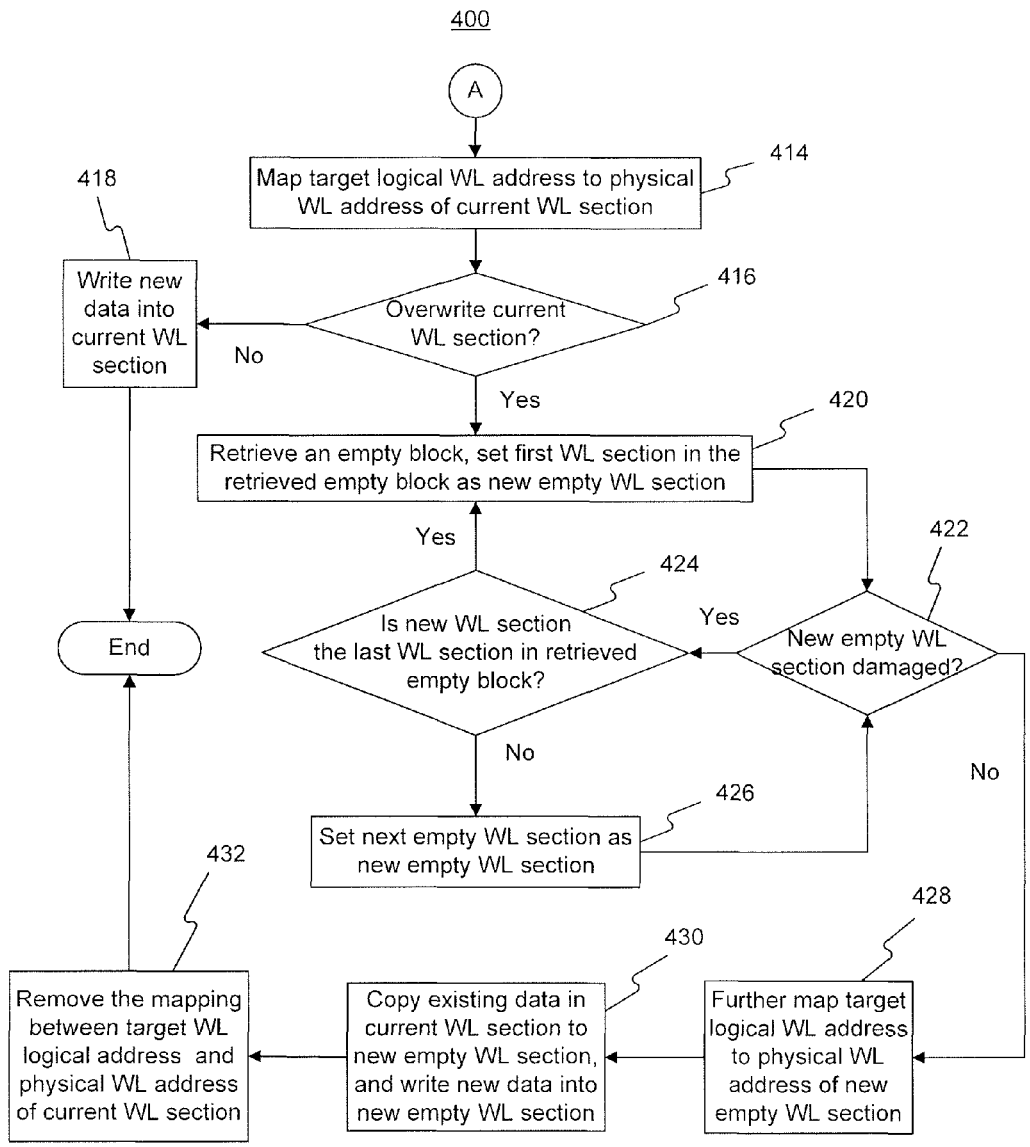

FIGS. 4A and 4B are a flow chart 400 showing an exemplary process consistent with embodiments of the disclosure for locating a good WL section, i.e., a WL section that is not damaged, and programming the good WL section. According to embodiments of the disclosure, a good WL section is located based on the damaged WL table 200, and then the located good WL section is used for writing new data. In some embodiments, a memory controller performs the process for locating and programming a good WL section.

In some embodiments, WL sections in one block are checked and, if good, used for programming in order according to their physical WL addresses. As shown in FIG. 4A, at 402, a current block is checked to determine whether it is full and thus another block is needed. Here, a current block means a block currently being checked. Various approaches may be employed to check whether the current block is full. For example, whether the current block is full may be determined by checking a count for the current block, which is kept to record the number of WL sections that have already been checked. When a WL section is checked and either used for programming or determined to be damaged, the count is incremented by 1. The count is checked to determine whether it is equal to the number of WL sections in the current block and, if yes, the current block is determined to be full. As another example, the last page of the current block may be read to determine whether the current block is full. If the last page of the current block has already been programmed, the current block is determined to be full.

If the current block is not full, the process proceeds to 404, at which the first non-full WL section in the current block is set as a current WL section. At 406, the current WL section is checked against the damaged WL table 200 to determine whether the current WL section is damaged. As described above, the physical WL address of the current WL section is used as an index to search the damaged WL table 200 to check whether the current WL section is recorded in the damaged WL table 200.

If, at 402, the current block is determined to be full, the process proceeds to 408, at which an empty block is retrieved and set as the current block, and a first WL section in the retrieved empty block is set as the current WL section. The process then proceeds to 406. In some embodiments, an empty-block queue is used to record all empty blocks. When data in a block is completely erased, the block is pushed into the empty-block queue, waiting to be retrieved in the future. Therefore, at 408, the empty block may be retrieved from the empty-block queue.

If the current WL section is determined to be damaged at 406, it is further determined whether the current WL section is the last WL section in the current block to determine whether another block needs to be used (410). If the current WL section is the last WL section in the current block, the process proceeds to 408 to retrieve an empty block for further process. If the current WL section is not the last WL section in the current block, the process proceeds to 412, at which a new WL section next to the current WL section (that is, the physical WL address of the new WL section follows the physical WL address of the current WL section) is retrieved and set as the current WL section for further process. The process then proceeds to 406 to check whether this WL section is damaged.

As shown in FIG. 4B, if the current WL section is not damaged, a logical WL address to which the host intends to write new data (hereinafter referred to as target logical WL address) is mapped to the physical WL address of the current WL section (414). The WL L2P table 300 is updated to reflect this mapping. At 416, it is determined whether the current WL section is to be overwritten. If the current WL section already has data stored therein, then the current WL section needs to be overwritten. If the current WL section does not have existing data stored therein, i.e., if the current WL section is an empty WL section, the current WL section does not need to be overwritten, and the new data is directly written into the current WL section (418).

Figure 5:
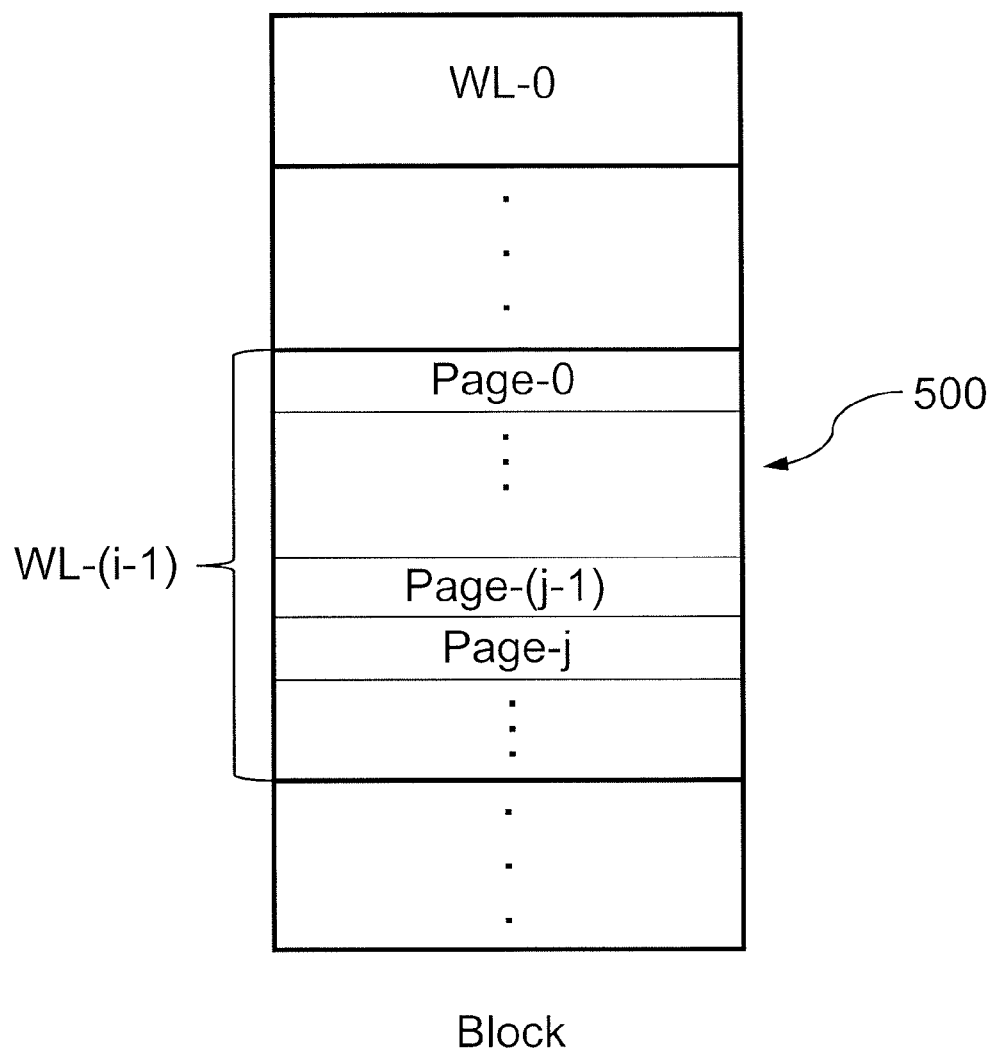
FIG. 5 schematically shows an exemplary block of memory cells.

On the other hand, if the current WL section has existing data, then the current WL section needs to be "overwritten." However, the new data cannot be written into the current WL section directly. For example, FIG. 5 schematically shows an exemplary block 500 of memory cells. With reference to FIG. 5, the i-th WL section WL-(i−1) is the current WL section, in which the first j pages Page-0-Page-(j−1) already have data stored therein. The next empty page is Page-j, which is not the first page of the current WL section WL-(i−1). However, the new data cannot be written into Page-j directly. The existing data of the current WL section, i.e., section WL-(i−1), needs to be copied to another WL section that is empty and the new data written into the another WL section. Therefore, at 420 of FIG. 4B, an empty block is retrieved and the first WL section in the retrieved empty block is set as a new empty WL section. In some embodiments, the empty block is retrieved from the empty-block queue.

At 422, the new empty WL section is checked to determine whether it is damaged. If yes, the new WL section is checked to determine whether it is the last WL section in the retrieved empty block (424). If yes, the process proceeds to 420, at which another empty block is retrieved. If the new WL section is not the last WL section in the retrieved empty block, a next empty WL section next to the new empty WL section (that is, the physical WL address of the next empty WL section follows the physical WL address of the new empty WL section) is set as the new empty WL section (426). The process then proceeds to 422.

If, at 422, the new empty WL section is determined to be a good WL section, i.e., not damaged, the target logical WL address is further mapped to the physical WL address of the new empty WL section (428). At this stage, the target logical WL address is in fact mapped to two physical WL addresses—the physical WL address of the current WL section and the physical WL address of the new empty WL section. The existing data in the current WL section is then copied to the new empty WL section, and the new data is written into the new empty WL section (430). At 432, the mapping between the target logical WL address and the physical WL address of the current WL section is removed so that the target logical WL address is only mapped to the physical WL address of the new empty WL section (which at this stage is in fact not empty). The WL L2P table 300 is updated.

Figure 6:
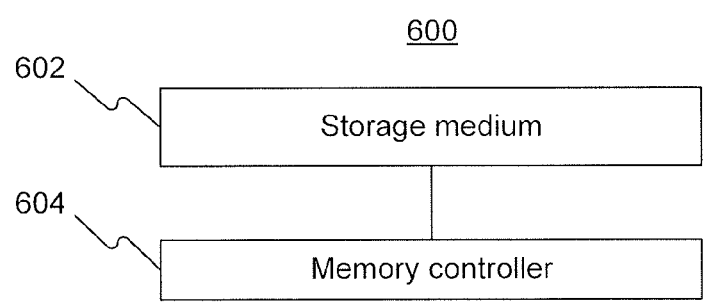
FIG. 6 schematically shows an apparatus for controlling programming of a memory according to an exemplary embodiment.

FIG. 6 schematically shows an exemplary apparatus 600 for controlling programming of a memory, consistent with embodiments of the disclosure. The apparatus 600 includes a storage medium 602 and a memory controller 604. In some embodiments, the storage medium 602 stores a damaged WL table consistent with embodiments of the disclosure. In some embodiments, the storage medium 602 also stores a WL L2P table consistent with embodiments of the disclosure. The memory controller 604 is configured to perform the methods consistent with embodiments of the disclosure for managing damaged WL sections in a memory and programming the memory in the presence of damaged WL sections. In some embodiments, the apparatus 600 is located in the host.

In the embodiments described above, a WL section containing a group of pages controlled by a same WL is employed as a unit for managing and processing. However, a section containing more pages, such as a group of pages controlled by two or more WLs, may serve as the unit for managing and processing. For example, as a more general unit for managing and processing, a section may include one WL section, two WL sections, or even more WL sections. The descriptions in the disclosure with respect to a WL section also generally apply to such a section. Thus, more generally, a table recording information about whether a section is good or damaged is provided and is referred to as a damaged section table. Moreover, each section may be assigned a physical address (referred to herewith as "physical section address") and the sections recorded in the damaged section table may be identified by their physical section addresses. A section L2P table may also be provided, which contains address mapping for one or more sections. Each address mapping relates a logical address of a section (referred to herewith as "logical section address") to a physical section address of that section.

For example, in such embodiments, a damaged section table is provided to record information about whether a section is good or damaged.

Other embodiments of the disclosure will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for programming a non-volatile memory including a plurality of blocks, each block including a plurality of sections, each section including at least one page, and each page including a plurality of memory cells, the method comprising:
    checking a current section of the plurality of sections against a damaged section table to determine whether the current section is damaged, the damaged section table recording information about whether a section in the memory is good or damaged; and
    using the current section for programming if the current section is not damaged.

2. The method according to claim 1,
    wherein the damaged section table comprises bit indicators corresponding to at least some of the plurality of sections, each of the bit indicators having one of a first value and a second value, the first value indicating the corresponding section is a damaged section, and the second value indicating the corresponding section is a good section, and
    wherein checking the current section against the damaged section table includes determining whether the bit indicator corresponding to the current section has the first value or the second value.

3. The method according to claim 1, further comprising:
    testing at least some of the sections to identify damaged sections and good sections, a section being a damaged section if at least one memory cell in the section is not accessible or not capable of storing data; and
    inserting information into the damaged section table indicating whether the tested sections are damaged according to the testing results.

4. The method according to claim 1, further comprising:
    checking whether a current block is full, and
    if the current block is full:
        finding an empty block; and
        setting a first section in the empty block as the current section, and
    if the current block is not full, setting a first non-full section in the current block as the current section.

5. The method according to claim 4, wherein finding an empty block includes:
    retrieving the empty block from an empty-block queue.

6. The method according to claim 1,
    wherein the damaged section table records physical addresses of some of the plurality of sections, and
    wherein checking the current section against the damaged section table includes using a physical address of the current section to locate information in the damaged section table about whether the current section is good or damaged.

7. The method according to claim 1, wherein using the current section for programming comprises:
    determining whether the current section is empty; and
    if the current section is determined to be empty, writing new data into a first page of the current section; and
    if the current section is determined to be not empty:
        finding a new good section, the new good section being an empty section;
        copying existing data in the current section to the new good section; and
        writing the new data into the new good section.

8. The method according to claim 7,
    wherein the existing data is saved in first one or more pages of the current section,
    wherein copying the existing data to the new good section includes copying the existing data to a first one or more pages of the new good section, and
    wherein writing the new data into the new good section includes writing the new data into a page following the first one or more pages of the new good section.

9. The method according to claim 7, wherein finding a new good section includes:
    finding an empty block; and
    setting a first section in the empty block as the new good section.

10. The method according to claim 9, wherein finding an empty block includes:
    retrieving the empty block from an empty-block queue.

11. The method according to claim 1,
    wherein the section is a word line (WL) section including at least one page controlled by a same WL and the damaged section table is a damaged WL table recording information about whether a WL section is good or damaged,
    wherein checking the current section against the damaged section table includes checking a current WL section against the damaged WL table, and
    wherein using the current section for programming includes using the current WL section for programming.

12. An apparatus for controlling programming of a non-volatile memory including a plurality of blocks, each block including a plurality of sections, each section including at least one page controlled by a same word line, and each page including a plurality of memory cells, the apparatus comprising:
    a storage medium configured to store a damaged section table recording information about whether a section in the memory is good or damaged; and
    a controller configured to:
        check a current section of the plurality of sections against the damaged section table to determine whether the current section is damaged; and use the current section for programming if the current section is not damaged.

13. The apparatus according to claim 12, wherein the damaged section table comprises bit indicators corresponding to at least some of the plurality of sections, each of the bit indicators having one of a first value and a second value, the first value indicating the corresponding section is a damaged section, and the second value indicating the corresponding section is a good section, the controller being further configured to:
 determine whether the bit indicator corresponding to the current section has the first value or the second value.

14. The apparatus according to claim 12, wherein the controller is further configured to:
 check whether a current block is full, and
  if the current block is full:
   find an empty block; and
   set a first section in the empty block as the current section, and
  if the current block is not full, set a first non-full section in the current block as the current section.

15. The apparatus according to claim 14, wherein the controller is further configured to:
 retrieve the empty block from an empty-block queue.

16. The apparatus according to claim 12, wherein the damaged section table records physical addresses of some of the plurality of sections;
 the controller being further configured to:
  use a physical address of the current section to locate information in the damaged section table about whether the current section is good or damaged.

17. The apparatus according to claim 12, wherein the controller is further configured to:
 determine whether the current section is empty, and
  if the current section is determined to be empty, write new data into a first page of the current section, and
  if the current section is determined to be not empty:
   find a new good section, the new good section being an empty section,
   copy existing data in the current section to the new good section, and
   write the new data into the new good section.

18. The apparatus according to claim 17, wherein the existing data is saved in a first one or more pages of the current section,
 the controller being further configured to:
  copy the existing data to a first one or more pages of the new good section, and
  write the new data into a page following the first one or more pages of the new good section.

19. The apparatus according to claim 17, wherein the controller is further configured to:
 find an empty block, and
 set a first section in the empty block as the new good section.

20. The apparatus according to claim 19, wherein the controller is further configured to:
 retrieve the empty block from an empty-block queue.

21. The apparatus according to claim 12, wherein the section is a word line (WL) section including at least one page controlled by a same WL and the damaged section table is a damaged WL table recording information about whether a WL section is good or damaged,
 the controller being configured to:
  check a current WL section against the damaged WL table to determine whether the current WL section is damaged, and
  use the current WL section for programming if the current WL section is not damaged.

\* \* \* \* \*